United States Patent
Asayama (10) Patent No.: US 7,821,815 B2
(45) Date of Patent: Oct. 26, 2010

(54) MEMORY CELL AND SEMICONDUCTOR MEMORY DEVICE HAVING THEREOF MEMORY CELL

(75) Inventor: Shinobu Asayama, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 205 days.

(21) Appl. No.: 12/230,685

(22) Filed: Sep. 3, 2008

(65) Prior Publication Data

US 2009/0059655 A1  Mar. 5, 2009

(30) Foreign Application Priority Data

Sep. 4, 2007  (JP) .............................. 2007-228880

(51) Int. Cl.
*G11C 11/00* (2006.01)
(52) U.S. Cl. .................................. 365/154; 365/230.05
(58) Field of Classification Search .................. 365/154, 365/156, 230.05
See application file for complete search history.

(56) References Cited

U.S. PATENT DOCUMENTS

| 6,370,078 | B1 * | 4/2002 | Wik et al. .............. 365/230.05 |
| 6,707,708 | B1 * | 3/2004 | Alvandpour et al. ........ 365/154 |
| 6,856,555 | B2 | 2/2005 | Fujimoto |
| 7,504,695 | B2 * | 3/2009 | Martelloni et al. .......... 257/368 |
| 7,577,014 | B2 * | 8/2009 | Yamagami .................. 365/154 |
| 2004/0190351 | A1 | 9/2004 | Fujimoto |

FOREIGN PATENT DOCUMENTS

JP  2004-288306  10/2004

* cited by examiner

*Primary Examiner*—Anh Phung
(74) *Attorney, Agent, or Firm*—McGinn IP Law Group PPLC (57) ABSTRACT

Conventional semiconductor memory devices have a problem of a data read failure caused by a leak current. To address this problem, a semiconductor memory device of the present invention including memory cells each formed of a transfer transistor, a load transistor and a drive transistor. Each of the memory cells includes: a first transfer transistor connected to a connection point of the drive transistor and the load transistor; a second transfer transistor connected between the first transfer transistor and a bit line DB; and a compensation transistor connected between a constant voltage node and a connection point of the first transfer transistor and the second transfer transistor. The compensation transistor is switched to a conductive state exclusively from at least one of the first transfer transistor and the second transfer transistor.

20 Claims, 6 Drawing Sheets

MEMORY CELL AND SEMICONDUCTOR MEMORY DEVICE HAVING THEREOF MEMORY CELL

BACKGROUND OF THE INVENTION

1. Field of the Invention

The present invention relates to a memory cell and a semiconductor memory device having thereof memory cell, and particularly to a single memory cell configured by a transfer transistor, a load transistor, and a drive transistor.

2. Description of the Related Art

Figure 5:
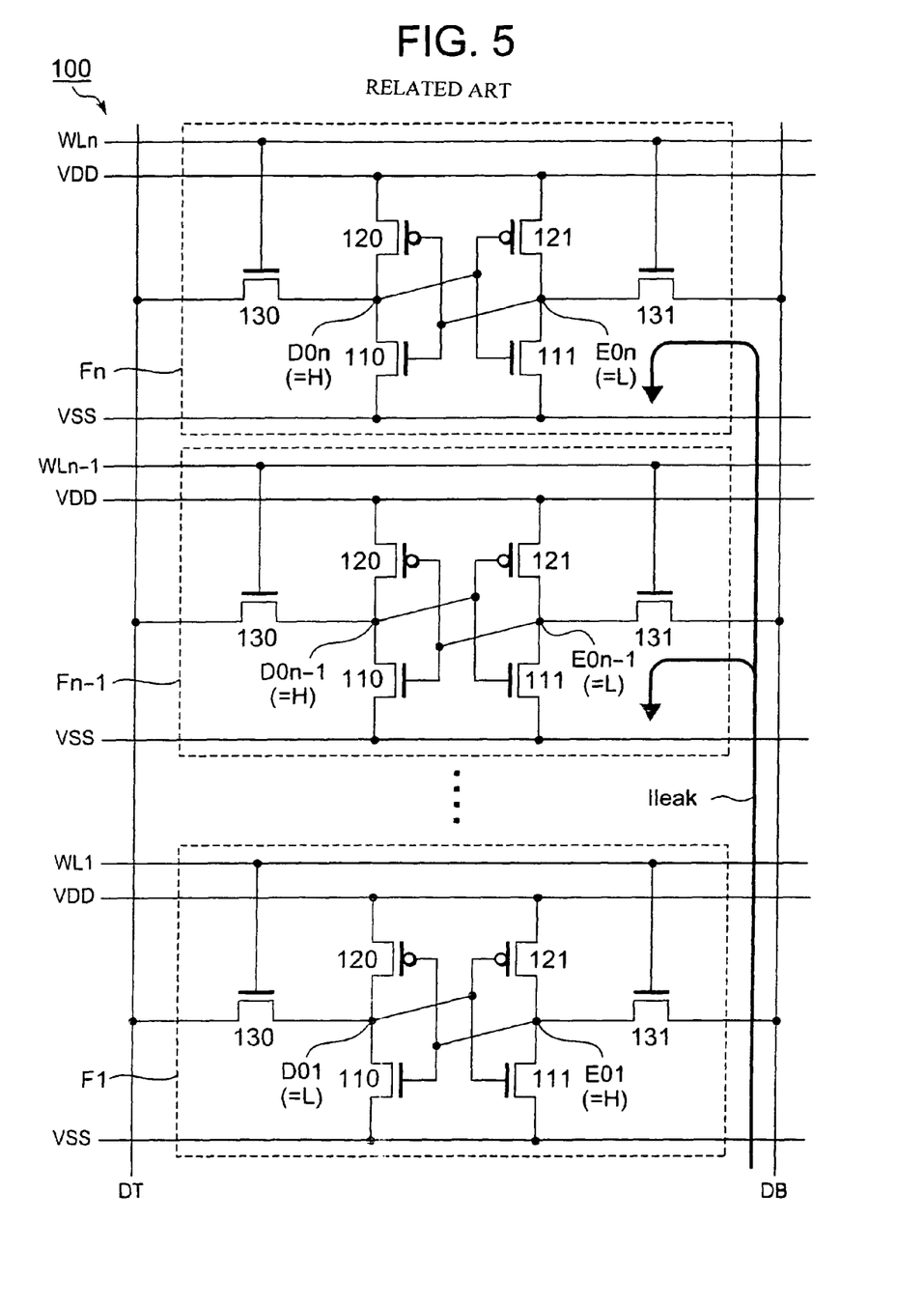
FIG. 5 is a related art of a SRAM.

An SRAM (Static Random Access Memory) is one of semiconductor memory devices. Here, an example of a circuit of an SRAM is shown in FIG. 5. In an SRAM 100 shown in FIG. 5, a plurality of memory cells F1 to Fn are connected to a bit line pair configured by bit lines DT and DB. The memory cells F1 to Fn each include drive transistors 110, 111, drive transistors 120, 121, and transfer transistors 130, 131. Data are stored in storage nodes of connection points at each of which the drive transistor and the drive transistor are connected to each other, and read out by transfer of the data to the bit lines DT and DB via the transfer transistors.

Figure 6:
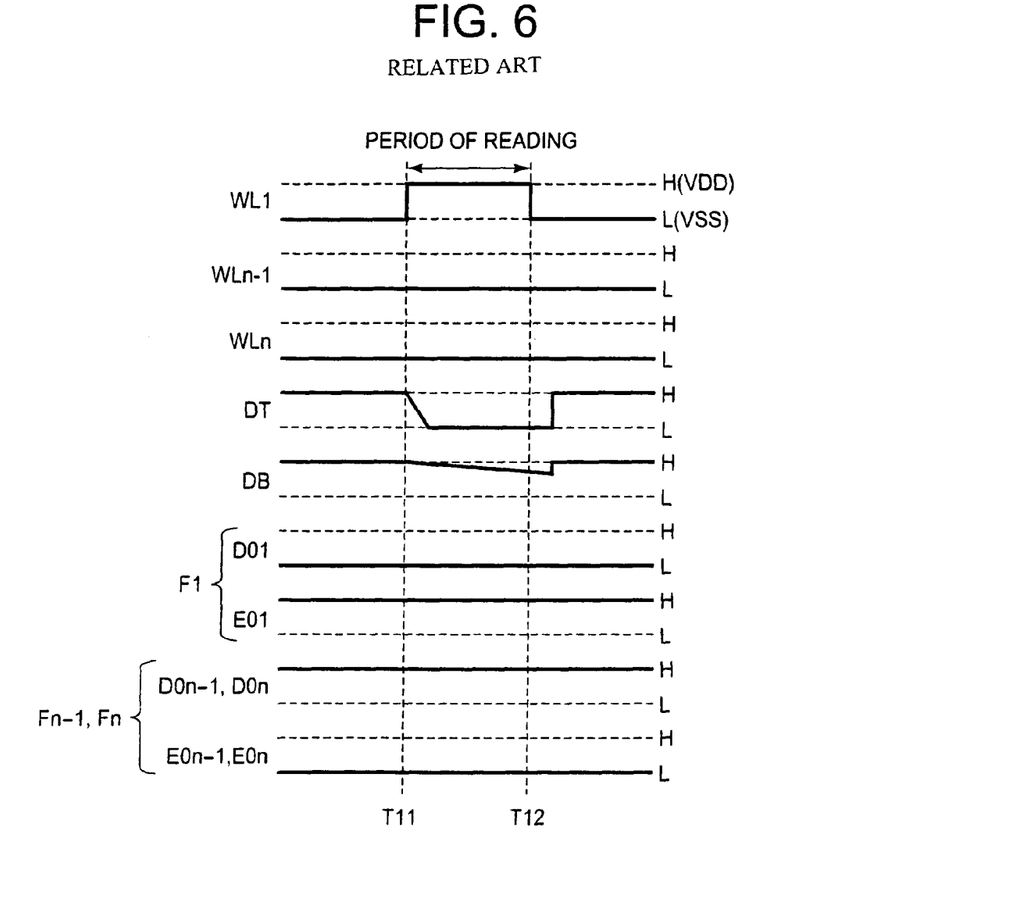
FIG. 6 is a timing chart, made by the inventors, for explaining a problem in read operation of an SRAM.

Here, a timing chart of operations for reading data stored in a memory cell F1 is shown in FIG. 6. In an example shown in FIG. 6, storage nodes D01, D0$n$–1, D0$n$ at the side of the bit line DT each are held at low level (for example, hold a ground voltage) while storage nodes E01, E0$n$–1, E0$n$ at the side of the bit line DB each are held at a high level (for example, hold a power supply voltage), in the memory cells F1, Fn–1, Fn, respectively.

In the timing chart shown in FIG. 6, the level of a word line WL1 for selecting the memory cell F1 becomes high in a period from timing T11 to timing T12. Meanwhile, even in the period from timing T11 to timing T12, word lines WLn–1 and WLn selecting memory cells Fn–1 and Fn are held at low level. Therefore, in the period from T11 to T12, data is read from the storage nodes D01 and E01 of the memory cell F1 to the bit lines DT and DB. As a result of reading the data, the bit line DT changes to low level, but the bit line DB is held at high level.

However, in the SRAM 100, the storage nodes E0$n$–1 and E0$n$ at the side of the bit line DB of the memory cells Fn–1 and Fn are held at low level, whereas the bit line DB changes to high level after the reading of data. Thus, a potential difference occurs between the source and drain of the respective transfer transistors 131 of the memory cells Fn–1 and Fn. Here, since the word lines WLn–1 and WLn are at low level, the transfer transistor 131$s$ are in a nonconductive state, but a potential difference between the bit line DB and the storage node of each of the memory cells Fn–1 and Fn lets leak currents Ileak flow between the source and the drain of the transfer transistor 131 of each of the memory cells Fn–1 and Fn. Further, since there is substantially no potential difference between the bit line DB and the storage node E01 on the side of the bit line DB, the transfer transistor 131 is conductive, but is in a state equivalent to a nonconductive state. Thus, the bit line DB has a high impedance. Therefore, in the SRAM 100, the potential of the bit line DB which has to be held at high level is reduced. In the timing chart shown in FIG. 6 as well, the potential of the bit line DB is reduced in the period of the timing T11 to T12.

In recent semiconductor memory devices, an operating supply voltage is set low so as to reduce power consumption. Therefore, a potential difference between high level and low level in the bit lines DT and DB is small. Such a semiconductor memory device has a problem that, when a potential reduces in a bit line, a potential difference from another bit line cannot be detected correctly in a sense amplifier to which the bit lines are connected, so that a data read failure occurs.

Therefore, Japanese Patent Application Publication No. 2004-288306 (JP-A2004-288306) discloses a technique to prevent a potential reduction in a bit line from causing a data read failure. In JP-A2004-288306, the semiconductor memory device includes a leak detection line, a leak generation circuit, and a signal correction circuit in addition to memory cells and bit lines. The leak detection line is disposed in parallel to the bit lines. The leak generation circuit supplies a leak current to the leak detection line. The signal correction circuit detects a potential state of the leak detection line, and corrects a signal transferred via the bit line. That is, in JP-A2004-288306, the potential level of a signal transferred via the bit line is corrected based on the potential of the leak detection line having a potential reduction by a leak current, and on the potential of the bit line. In JP-A2004-288306, a data read failure is thus avoided even when the potential is reduced by a leak current in a bit line.

The following analyses are given by the present invention. In JP-A2004-288306, since the leak detection line, the leak generation circuit, and the signal correction circuit are added to the memory cells and bit lines, the circuit size is inevitably increased. Further, the leak generation circuit and memory cell are formed by use of different transistors, respectively. Therefore, it is likely that variation in transistors in manufacturing processes causes variation between a leak current amount generated in the leak generation circuit, and a leak current amount generated in the memory cell. That is, in JP-A2004-288306, the leak current amount of the memory cell may not necessarily correspond to the leak current amount of the leak generation circuit in some cases, which causes a problem of deteriorating a data read accuracy.

SUMMARY

An aspect of the present invention is provision of a semiconductor memory device in which a single memory cell is formed of a transfer transistor, a load transistor and a drive transistor. The semiconductor memory device includes a first transfer transistor which is connected to a connection point of the load transistor and the drive transistor; a second transfer transistor which is connected between the first transfer transistor and a bit line; and a compensation transistor which is connected between a constant voltage node and a connection point of the first and second transfer transistors, and which is switched to a conductive state exclusively from at least one of the first and second transfer transistors.

Another aspect of the present invention is provision of a semiconductor memory device in which a single memory cell is formed of a transfer transistor, a load transistor, and a drive transistor, a plurality of the memory cells are connected to a single bit line, and a read operation of data or a write operation thereof is performed on a single memory cell selected from among the plurality of memory cells. The memory cell includes a first transfer transistor which is connected to a connection point of the load transistor and the drive transistor; a second transfer transistor which is connected between the first transfer transistor and a bit line; and a compensation transistor which is connected between a constant voltage node and a connection point of the first and second transfer transistors, and which causes a voltage supplied to the constant voltage node to be supplied to a connection point of the first and second transfer transistor, while the read operation or the write operation is performed on other memory cell.

In the semiconductor memory device according to the present invention, the compensation transistor is switched to the conductive state exclusively from the first and second transfer transistors. Therefore, even when a potential difference occurs between a bit line and a storage node of a memory cell which is not selected, a voltage from the constant voltage node is supplied to the connection point of the first and second transfer transistors by the compensation transistor, so that no potential difference occurs between the source and the drain of the second transfer transistor. As a result, a leak current does not flow between the source and the drain of the second transfer transistor of the memory cell which is not selected. Hence, the semiconductor memory device of the present invention is capable of preventing a leak current from flowing into a memory cell via a bit line.

The semiconductor memory device in accordance with the present invention is capable of preventing a leak current from causing a data read failure.

BRIEF DESCRIPTION OF THE DRAWINGS

The above and other objects, advantages and the features of the present invention will be more apparent from the following description of certain preferred modes taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Embodiment 1

Figure 1:
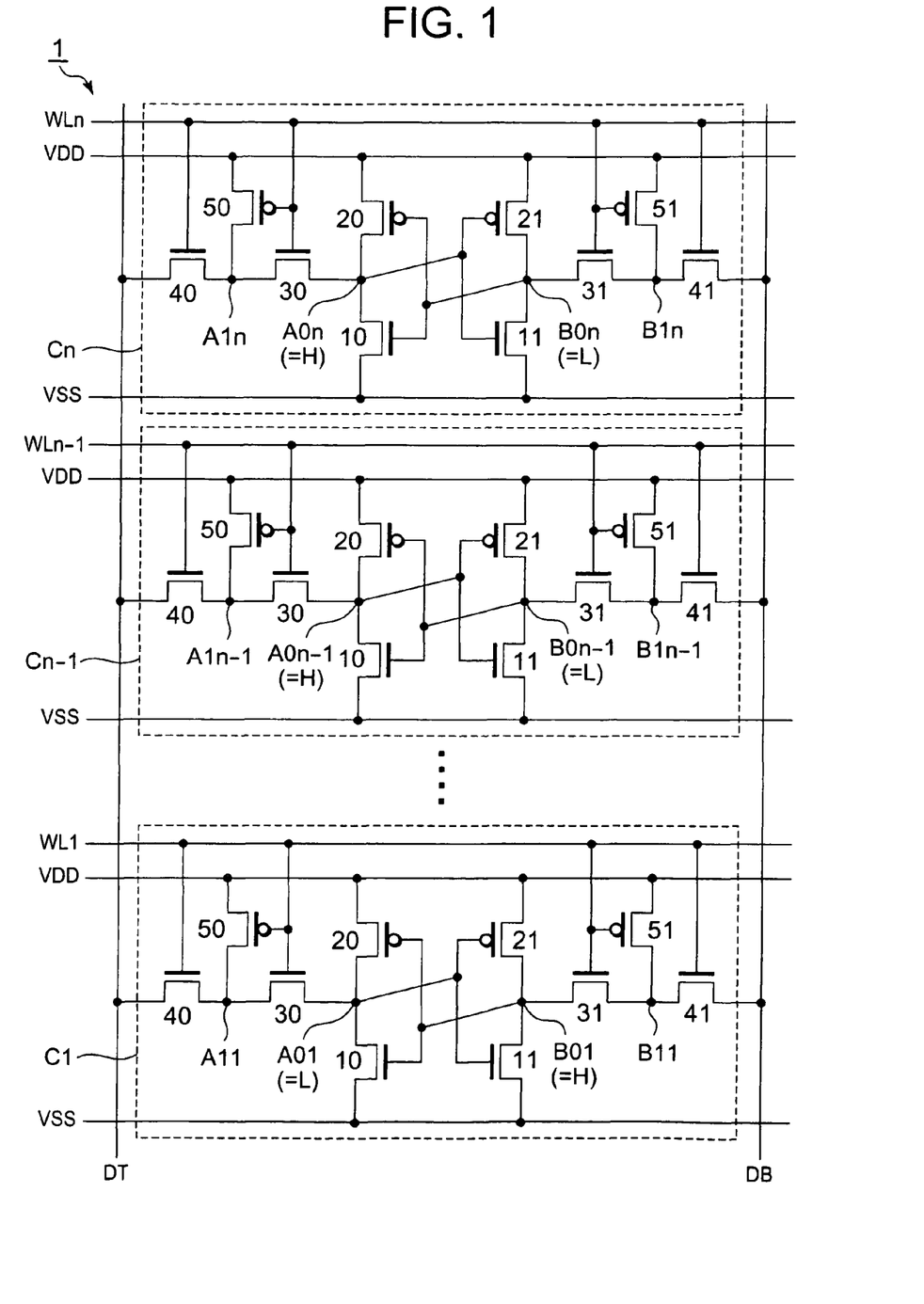
FIG. 1 is a circuit diagram of an SRAM according to Embodiment 1.

This embodiment of the present invention is described below with reference to the accompanying drawings. In this embodiment, an SRAM is described as an example of a semiconductor memory device. In FIG. 1, a circuit diagram of an SRAM 1 is shown. As shown in FIG. 1, in the SRAM 1, a plurality of memory cells are connected to a bit line pair composed of bit lines DT and DB. In this embodiment, memory cells C1 to Cn are connected to a bit line pair. In the SRAM 1, a potential difference between the bit lines DT and DB is detected by a sense amplifier (not shown) so that data stored in the memory cells is read.

The memory cells C1 to Cn have the same configuration, so that memory cell C1 is taken as an example for describing a memory cell. The memory cell C1 includes drive transistors 10, 11; drive transistors 20, 21; first transfer transistors 30, 31; and second transfer transistors 40, 41. In this embodiment, the drive transistors 10, 11, the first transfer transistors 30, 31 and the second transfer transistors 40, 41 are composed of NMOS transistors; and the second transfer transistors 40, 41 and compensation transistors 50, 51 are composed of PMOS transistors.

The drive transistor 10 and the load transistor 20 are connected in series between a power supply node VDD to supply a supply voltage and a ground node VSS to supply a ground voltage. Further, a gate of the drive transistor 10 and a gate of the load transistor 20 are connected in common. A connection point of a drain of the drive transistor 10 and a drain of the load transistor 20 forms a first storage node A01. The drive transistor 11 and the load transistor 21 are connected in series between the power supply node VDD and the ground node VSS. Further, a gate of the drive transistor 11 and a gate of the load transistor 21 are connected in common. A connection point of a drain of the drive transistor 11 and a drain of the load transistor 21 forms a second storage node B01. In addition, the first storage node A01 is connected to the gate of the drive transistor 11 and the load transistor 21. The second storage node B01 is connected to the gate of the drive transistor 10 and the load transistor 20.

The first transfer transistor 30 is connected to the first storage node A01. The second transfer transistor 40 is connected between the first transfer transistor 30 and the bit line DT. That is, the first transfer transistor 30 and the second transfer transistor 40 are connected in series between the first storage node A01 and the bit line DT. A connection point of the first transfer transistor 30 and the second transfer transistor 40 is hereinafter referred to as a first compensation node A11. A gate of the first transfer transistor 30 and a gate of the second transfer transistor 40 are both connected to the word line WL1. The word line WL1 transfers a control signal controlling a conductive state of the first and second transfer transistors 30, 40 and the compensation transistor 50. The SRAM 1 selects a memory cell to perform data writing and data reading according to this control signal. The compensation transistor 50 is connected between the first compensation node A11 and a constant voltage node. A gate of the compensation transistor 50 is connected to the word line WL1. In the constant voltage node, the same voltage is supplied as a voltage in a bit line holding a logical value at high level. Therefore, in this embodiment, the power supply node VDD is used as the constant voltage node.

The first transfer transistor 31 is connected to the second storage node B01. The second transfer transistor 41 is connected between the first transfer transistor 31 and the bit line DB. That is, the first transfer transistor 31 and the second transfer transistor 41 are connected in series between the second storage node B01 and the bit line DB. A connection point of the first transfer transistor 31 and the second transfer transistor 41 is hereinafter referred to as a second compensation node B11. A gate of the first transfer transistor 31 and a gate of the second transfer transistor 41 are each connected to the word line WL1. The compensation transistor 51 is connected between the second compensation node B11 and a constant voltage node (for example, a power supply node VDD). A gate of the compensation transistor 51 is connected to the word line WL1.

Here, in the memory cell Cn−1, a node corresponding to the first storage node A01 is referred to as a first storage node A0n−1; a node corresponding to the first compensation node A11 is referred to as a first compensation node A1n−1; a node corresponding to the second storage node B01 is referred to as a second storage node B0n−1; and a node corresponding to the second compensation node B11 is referred to as a second compensation node B1n−1. In the memory cell Cn, a node corresponding to the first storage node A01 is referred to as a first storage node A0n; a node corresponding to the first compensation node A11 is referred to as a first compensation node A1$n$; a node corresponding to the second storage node B01 is referred to as a second storage node B0$n$; and a node corresponding to the second compensation node B11 is referred to as a second compensation node B1$n$. Further, a word line of the memory cell C$n$–1 is referred to as a word line WL$n$–1, and a word line of the memory cell C$n$ is referred to as a word line WL$n$.

Next, read operation of data of the SRAM of this embodiment is described. Here, a description is given of a case where multiple memory cells holding different logical values are connected to a single bit line pair, and where data is read from one of the memory cells. As logical values which memory cells hold, there are a first logical value and a second logical value. The first logical value shows that the first memory node is held at low level (for example, the same voltage as a ground voltage, and denoted by "L" in FIG. 1), and that the second memory node is held at high level (for example, the same voltage as a supply voltage, and denoted by "H" in FIG. 1). The second logical value shows that the first storage node is held at high level, and that the second storage node is held at low level. In the example shown in FIG. 1, the memory cell C1 holds the first logical value, and the memory cells C$n$–1 and C$n$ have the second logical value.

Figure 2:
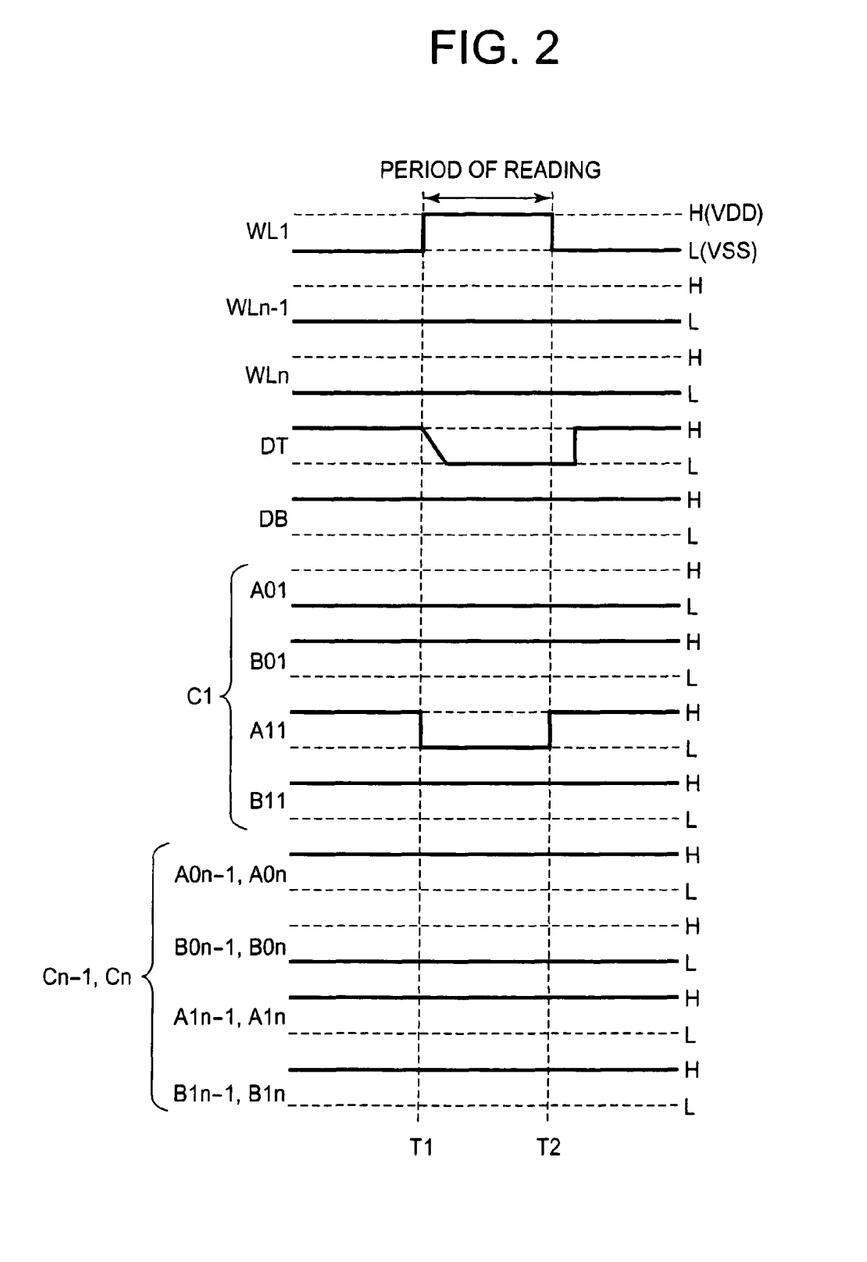
FIG. 2 is a timing chart of a read operation in the SRAM according to Embodiment 1.

In FIG. 2, a timing chart of a read operation in the SRAM 1 is shown. FIG. 2 shows a timing chart in a case where data is read from the memory cell C1. The read operation is performed in the period of time ranging from timing T1 to timing T2. In this period of time, the word line WL1 is set at high level. In addition, the SRAM 1 performs a precharge operation in a period in which an access to a memory cell is not performed, and the bit line pair is set under the precharge voltage. The precharge voltage of this embodiment has the same voltage value as the supply voltage.

At timing T1, when the level of the word line WL1 changes from low to high, the first transfer transistors 30, 31 and the second transfer transistors 40, 41 become conductive. Meanwhile, the compensation transistors 50, 51 become nonconductive. This causes the bit line DT and the first storage node A01 to be electrically connected to each other, and the bit line DT is set at low level based on data held in the first storage node A01 (here, low level). Meanwhile, the bit line DB and the second storage node B01 are also set to be electrically connected, but since data held in the second storage node B01 is set at high level, the bit line DB is held at high level. At this time, since there is substantially no potential difference between the second storage node B01 and the bit line DB, the first transfer transistor 31 and the second transfer transistor 41 are conductive, but are in a state equivalent to a nonconductive state. Thus, the bit line DB is turned into a high impedance state.

In contrast, since the word lines WL$n$–1 and WL$n$ is held at low level, in the memory cells C$n$–1 and C$n$, the first transfer transistors 30, 31 and the second transfer transistors 40, 41 are in a nonconductive state, and the compensation transistors 50, 51 are in a conductive state. Accordingly, in the memory cell C$n$–1, the bit line DT and the first storage node A0$n$–1 are in a nonconductive state, and the bit line DB and the second storage node B0$n$–1 are in a nonconductive state. Further, a supply voltage is supplied to the first compensation node A1$n$–1 and the second compensation node B1$n$–1. Here, the memory cell C$n$–1 and the second storage node B0$n$–1 are held at low level, while the bit line DB is held at high level.

Therefore, a potential difference occurs between the source and the drain of the first transfer transistor 31, so that a leak current flows from the second compensation node B1$n$–1 into the second storage node B0$n$–1 via the first transfer transistor 31. Meanwhile, a supply voltage is supplied to the second compensation node B1$n$–1 via the compensation transistor 51, so that no potential difference occurs between the source and the drain of the second transfer transistor 41 and that a leak current does not flow between the source and the drain of the second transfer transistor 41. That is, even when the bit line DB has a high impedance, a leak current flowing from the bit line DB into the memory cell C$n$–1 does not occur, so that the potential of the bit line DB is not reduced.

In the memory cell C$n$, the same logical value as in the memory cell C$n$–1 is held, and a control signal for low level (a potential of the word line WL$n$) is supplied to the memory cell C$n$. Therefore, also in the memory cell C$n$, a leak current flowing from the bit line DB into the memory cell C$n$ does not occurs as in the memory cell C$n$–1.

As described above, the SRAM 1 of this embodiment controls a compensation transistor so that the compensation transistor can be conductive exclusively from first and second transfer transistors in a data reading period. That is, when the first and second transfer transistors are in a nonconductive state, the compensation transistor causes a compensation node to have the same voltage value as a constant voltage node (for example, a voltage value at a time when a bit line is held at high level). Thus, there is substantially no potential difference between the source and the drain of the second transistor connected to the bit line held at high level. Accordingly, even when a storage node held at low level is connected to a bit line held in a high impedance state and at high level, via a transfer transistor held in a nonconductive state, it is possible to prevent a leak current from flowing between the source and the drain of the second transfer transistor. Specifically, since electric charges are not taken out from the bit line having a high impedance in the SRAM 1, the potential of the bit line having a high impedance is not reduced.

Further, in the SRAM 1 of this embodiment, a compensation transistor of a memory cell, which is not a target of the read operation, is set to be in a conductive state, while a read operation of data is being performed in the target memory cell. Thus, even when a potential difference occurs between a storage node and a bit line of the memory cell which is not the target of the read operation, it is possible to prevent a leak current flowing between the source and the drain of the second transfer transistor. Accordingly, it is possible to prevent a leak current from flowing from a bit line having a high impedance into a memory cell not being a target of a read operation, and to prevent a potential reduction of the bit line. In other words, the SRAM 1 of this embodiment exerts a more remarkable effect, when multiple memory cells are connected to a single bit line.

As described above, stabilization of a voltage value of a bit line enables a potential difference between multiple bit lines to be stabilized and secured in the SRAM 1. Therefore, even when a low operating supply voltage is used in the SRAM 1, a data read failure can be prevented. Further, in a semiconductor memory device described in JP-A2004-288306, a leak generation circuit and a signal correction circuit are added, but the SRAM 1 of this embodiment requires only a pair of a compensation transistor and another pair of transfer transistors. Accordingly, it is also possible to check increase in the size of a circuit.

Incidentally, when a first transfer transistor and a compensation transistor both become conductive at the same time, there is a risk that data in a storage node is destroyed. Hence, in order to prevent the data from being destroyed, it is preferable that the compensation transistor be controlled so as to be conductive exclusively from the first transfer transistor.

Embodiment 2

Figure 3:
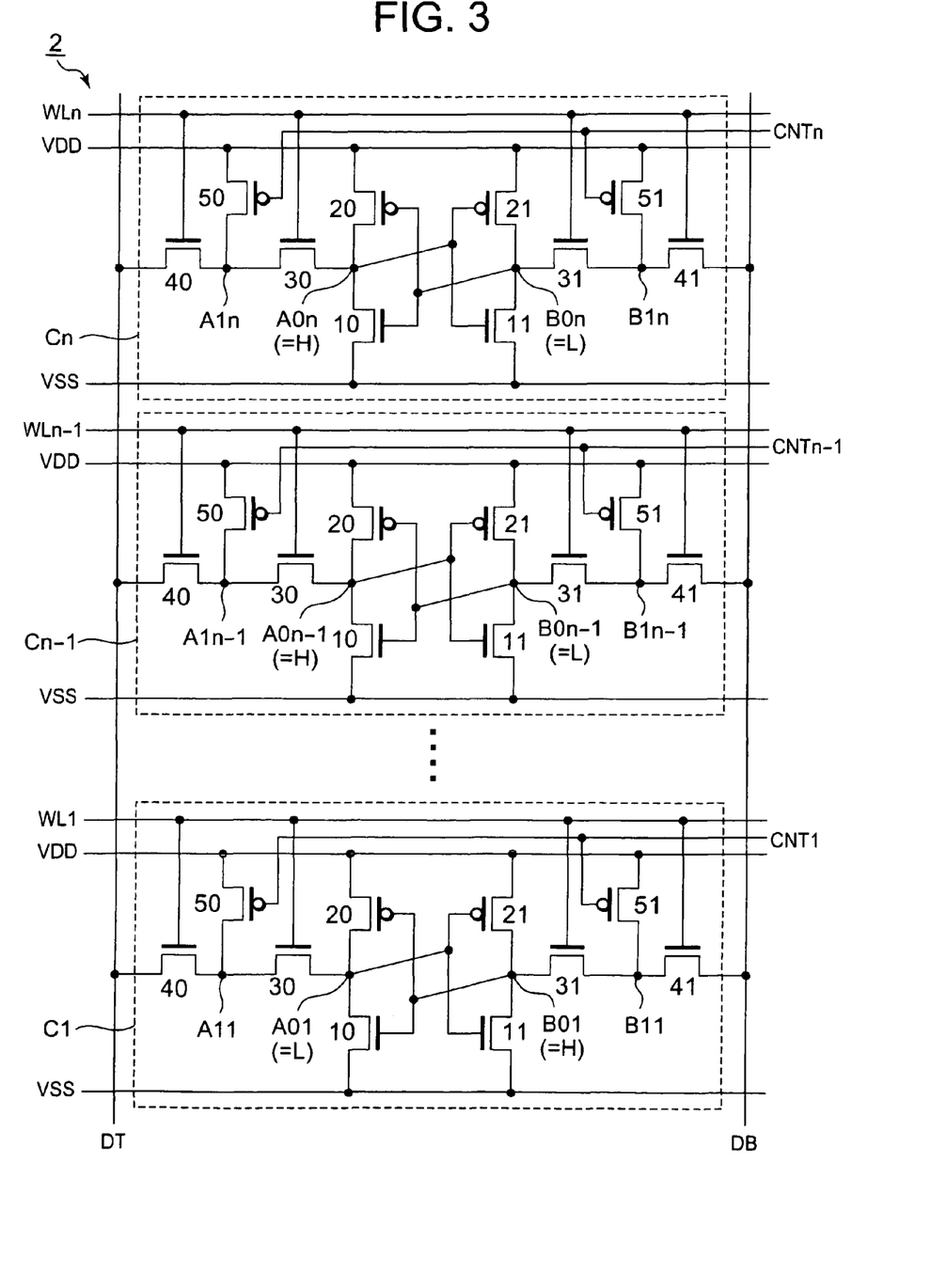
FIG. 3 is a circuit diagram of an SRAM according to Embodiment 2.

A circuit diagram of an SRAM 2 of this embodiment is shown in FIG. 3. As shown in FIG. 3, the SRAM 2 includes control signal lines CNT1 to CNTn which are different from the word lines WL1 to WLn. The control signal lines CNT1 to CNTn are connected to each gate of the compensation transistors 50, 51 of the memory cells C1 to Cn. In this embodiment, with control signals transferred via the word lines WL1 to WLn, conductivity states of the first transfer transistors 30, 31 and the second transfer transistors 40, 41 are controlled, and with control signals transferred via the control signal lines CNT1 to CNTn, conductivity states of the compensation transistors 50, 51 are controlled.

Figure 4:
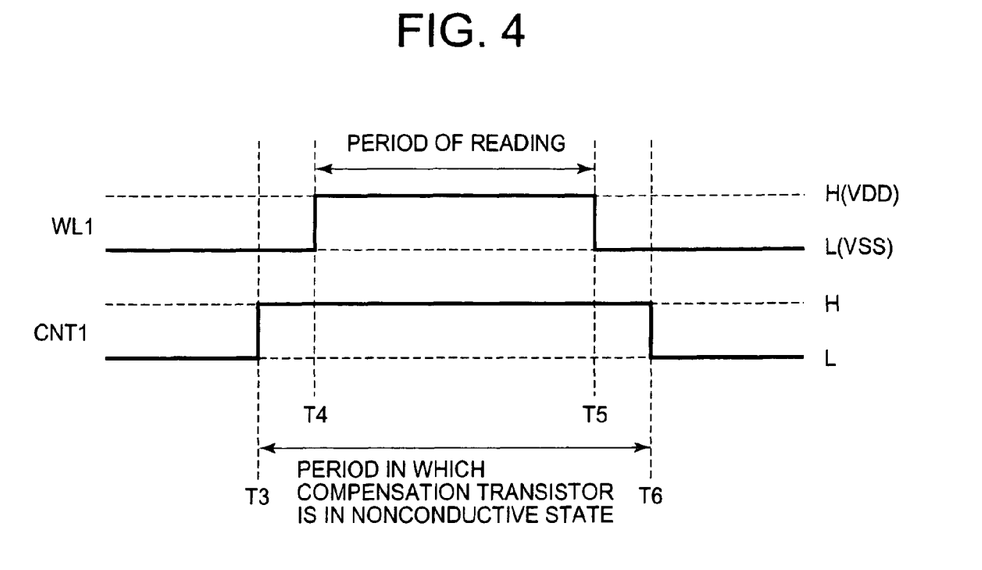
FIG. 4 is a timing chart showing a relationship among control signals according to Embodiment 2.

Here, a relationship between the two kinds of control signals in the SRAM 2 is shown in FIG. 4. Incidentally, in FIG. 4, only control signals given to the memory cell C1 are shown as an example. As shown in FIG. 4, a control signal of the word line WL1 is set at high level in a data reading period (timing T4 to T5). In contrast, a control signal of the control signal line CNT1 is set at high level for a longer period (timing T3 to T6) than the data reading period. That is, in the SRAM 2, the compensation transistor is in a nonconductive state for a longer period than the first and second transfer transistors are in a conductive state.

There is no problem, if the compensation transistor is in a conductive state exclusively from the first and second transfer transistors in a data reading period. However, the conductivity type of the first and second transfer transistors differs from that of the compensation transistor. Therefore, the threshold values of the first and second transistors and of the compensation transistor are different. In such a case, if the first and second transistors and the compensation transistor are controlled according to the same control signal, the first transfer transistor and the compensation transistor become conductive at the same time in some cases. In such a state, there is a risk that a supply voltage is applied to a storage node via the first transfer transistor so that data at low level held in the storage node is destroyed.

In contrast, in the SPAM 2, the transfer transistors are set to be conductive after the compensation transistor is changed to be nonconductive. This can prevent a supply voltage from being applied to a storage node held at low level in the SRAM 2. Further, in the SRAM 2, the compensation transistor is set to be in a conductive state after reading of data from the storage node is completed. Thus, when the transfer transistors are conductive, the compensation transistor never becomes conductive.

According to the above description, the SRAM 2 of Embodiment 2 has a higher capability in preventing data from being destroyed than the SRAM 1 of Embodiment 1, and is capable of enhancing the reliability of data. Incidentally, it is preferable that a difference between a data reading period and a period when the compensation transistor stays in a nonconductive state, be set small so as to prevent increase in a leak current.

It is to be understood that the present invention is not limited to the above-described embodiments, and various changes may be made therein without departing from the spirit of the present invention.

What is claimed is:

1. A semiconductor memory device comprising a plurality of memory cells, wherein
    each of the plurality of memory cells comprises:
        a drive transistor;
        a load transistor connected to a loading side of the drive transistor;
        a first transfer transistor connected to a connection point of the drive transistor and the load transistor;
        a second transfer transistor connected between the first transfer transistor and a bit line; and
        a compensation transistor connected between a constant voltage node and a connection point of the first and second transfer transistors, and
    the compensation transistor and the second transfer transistor are exclusively switched to a conductive state each other.

2. The semiconductor memory device according to claim 1, wherein a voltage is supplied to the constant voltage node, the voltage having the same voltage value as a voltage value of the bit line at a high level in a logic value.

3. The semiconductor memory device according to claim 1, wherein a supply voltage of the memory cell is supplied to the constant voltage node.

4. The semiconductor memory device according to claim 1, wherein the compensation transistor is switched from the nonconductive state to the conductive state when the first transfer transistor is in the nonconductive state.

5. The semiconductor memory device according to claim 1, wherein a gate of the first transfer transistor and a gate of the second transfer transistor are connected to a word line.

6. The semiconductor memory device according to claim 5, wherein, by use of a control signal line other than the word line, the compensation transistor is controlled so as to be switched between the conductive state and the nonconductive state.

7. The semiconductor memory device according to claim 6, wherein the compensation transistor is switched to the nonconductive state from the conductive state before the first and second transfer transistors are switched to the conductive state from the nonconductive state.

8. The semiconductor memory device according to claim 7, wherein the compensation transistor is switched to the conductive state from the nonconductive state after the first and second transfer transistors are switched to the nonconductive state from the conductive state.

9. The semiconductor memory device according to claim 6, wherein a period in which the compensation transistor is in the nonconductive state, is longer than a period in which any one of the first and second transfer transistors is in the conductive state.

10. The semiconductor memory device according to claim 1, wherein
    the drive transistor and the load transistor constitute an inverter circuit, and
    the first transfer transistor is connected to an output of the inverter circuit.

11. The semiconductor memory device according to claim 1, wherein
    the plurality of memory cells include a first memory cell and a second memory cell, and
    while a read operation and a write operation are performed on the first memory cell, the compensation transistor of the second memory supplies a voltage from the constant voltage node to the connection point of the first transfer transistor and the second transfer transistor in the second memory cell on which the read operation and the write operation are not performed.

12. The semiconductor memory device according to claim 11, wherein the first memory cell and the second memory cell are connected to the same bit line.

13. A memory cell comprising:

a drive transistor;

a load transistor connected to a loading side of the drive transistor;

a first transfer transistor connected to a connection point of the drive transistor and the load transistor;

a second transfer transistor connected between the first transfer transistor and a bit line; and a compensation transistor connected between a constant voltage node and a connection point of the first and second transfer transistors, wherein the compensation transistor and the second transfer transistor are exclusively switched to a conductive state each other.

14. The memory cell according to claim 13, wherein a voltage is supplied to the constant voltage node, the voltage having the same voltage value as a voltage value of the bit line at a high level in a logic value.

15. The memory cell according to claim 14, wherein a supply voltage of the memory cell is supplied to the constant voltage node.

16. The memory cell according to claim 14, wherein the compensation transistor is switched from the nonconductive state to the conductive state when the first transfer transistor is in the nonconductive state.

17. The memory cell according to claim 14, wherein a gate of the first transfer transistor and a gate of the second transfer transistor are connected to a word line.

18. The memory cell according to claim 17, wherein, by use of a control signal line other than the word line, the compensation transistor is controlled so as to be switched between the conductive state and the nonconductive state.

19. The memory cell according to claim 18, wherein the compensation transistor is switched to the nonconductive state from the conductive state before the first and second transfer transistors are switched to the conductive state from the nonconductive state.

20. The memory cell according to claim 19, wherein the compensation transistor is switched to the conductive state from the nonconductive state after the first and second transfer transistors are switched to the nonconductive state from the conductive state.

* * * * *